(12) United States Patent
Byeon

(10) Patent No.: US 10,250,261 B1
(45) Date of Patent: Apr. 2, 2019

(54) SIGNAL TRANSMITTING CIRCUIT

(71) Applicant: SK hynix Inc., Gyeonggi-do (KR)

(72) Inventor: Sang-Jin Byeon, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 0 days.

(21) Appl. No.: 16/132,787

(22) Filed: Sep. 17, 2018

Related U.S. Application Data

(60) Provisional application No. 62/644,132, filed on Mar. 16, 2018.

(51) Int. Cl.
| | | |
|---|---|---|
| *H03K 19/094* | (2006.01) |
| *H03K 19/0185* | (2006.01) |
| *H04B 1/04* | (2006.01) |
| *G06F 1/26* | (2006.01) |
| *G01R 19/165* | (2006.01) |
| *H03K 3/012* | (2006.01) |
| *H03K 5/24* | (2006.01) |
| *G05F 3/02* | (2006.01) |

(52) U.S. Cl.
CPC ........... *H03K 19/018521* (2013.01); *G01R 19/16552* (2013.01); *G06F 1/26* (2013.01); *H03K 3/012* (2013.01); *H04B 1/04* (2013.01); *G05F 3/02* (2013.01); *H03K 5/2472* (2013.01)

(58) Field of Classification Search
None
See application file for complete search history.

(56) References Cited

U.S. PATENT DOCUMENTS

| | | | | |
|---|---|---|---|---|
| 2015/0229299 | A1* | 8/2015 | Yoon | H03K 19/018592 327/143 |
| 2015/0244359 | A1* | 8/2015 | Tran | H03K 17/223 327/143 |

FOREIGN PATENT DOCUMENTS

KR    1020170064842    6/2017

* cited by examiner

*Primary Examiner* — Anh Q Tran
(74) *Attorney, Agent, or Firm* — IP & T Group LLP

(57) ABSTRACT

A signal transmitting circuit may include: a logic gate coupled in series to transmit a signal, and operated by a first supply voltage; a pre-driver circuit suitable for generating a pull-up control signal and a pull-down control signal in response to the transmitted signal, wherein a second supply voltage having a level greater than the target level of the first supply voltage is used to generate the pull-up and pull-down control signals; a first NMOS transistor suitable for pulling up an output node using the first supply voltage, in response to the pull-up control signal; a second NMOS transistor suitable for pulling down the output node using a pull-down voltage, in response to the pull-down control signal; and an initialization circuit suitable for initializing the pull-up and pull-down control signals when the level of the first supply voltage is less than a reference value, before a power-up signal is enabled.

20 Claims, 4 Drawing Sheets

SIGNAL TRANSMITTING CIRCUIT

CROSS-REFERENCE TO RELATED APPLICATION

This application claims the benefit of U.S. Provisional Application No. 62/644,132 filed on Mar. 16, 2018, the entire contents of which are incorporated herein by reference.

BACKGROUND

1. Field

This patent document relates to a signal transmitting circuit.

2. Discussion of the Related Art

Internal circuits of various semiconductor devices such as a memory device operate while exchanging various signals with other circuits. Therefore, the semiconductor devices include a plurality of circuits for transmitting and receiving signals with the other circuits.

Since one semiconductor device uses a plurality of voltages having different levels, circuits for transmitting and receiving signals in the semiconductor device may use different voltages.

SUMMARY

Various embodiments are directed to a technology for reducing a malfunction and current consumption of a signal transmitting circuit using a plurality of voltages.

In an embodiment, a signal transmitting circuit may include: a logic gate suitable for transmitting a signal, and operated by a first supply voltage; a pre-driver circuit suitable for generating a pull-up control signal and a pull-down control signal in response to the transmitted signal, wherein a second supply voltage having a level greater than the target level of the first supply voltage is used to generate the pull-up control signal and the pull-down control signal; a first NMOS transistor suitable for pulling up an output node using the first supply voltage, in response to the pull-up control signal; a second NMOS transistor suitable for pulling down the output node using a pull-down voltage, in response to the pull-down control signal; and an initialization circuit suitable for initializing the pull-up control signal and the pull-down control signal when the level of the first supply voltage is less than a reference value, before a power-up signal is enabled.

DETAILED DESCRIPTION

Figure 1:
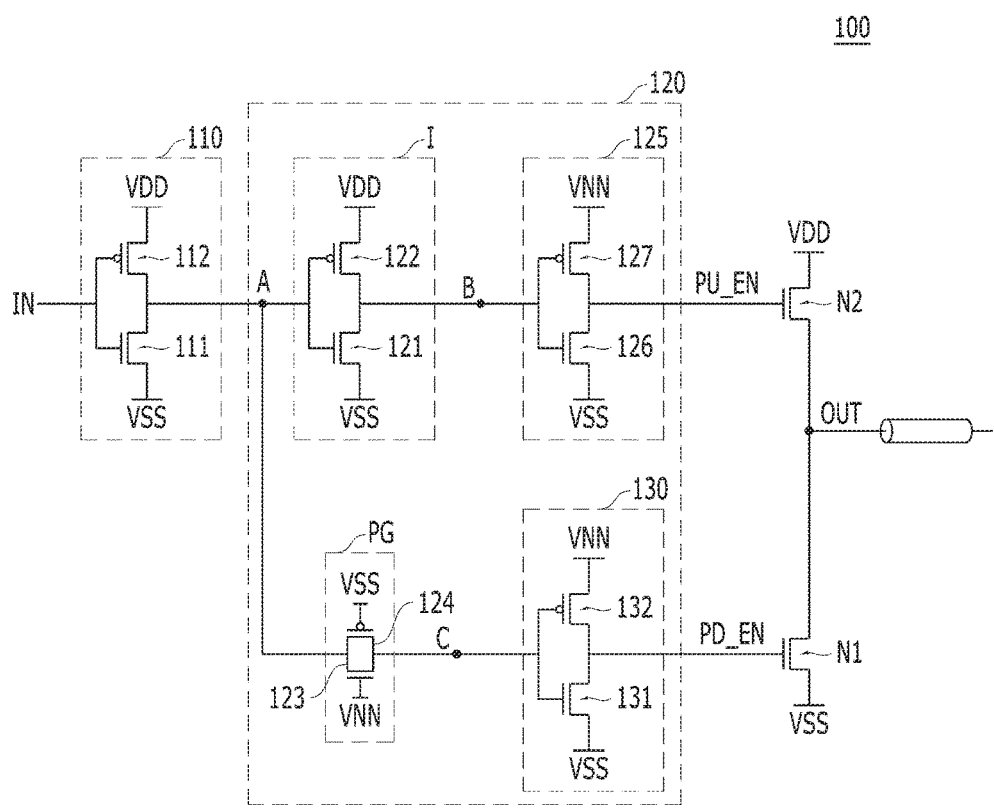
FIG. 1 is a circuit diagram illustrating a signal transmitting circuit in accordance with an embodiment.

Various embodiments will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention. It is noted that reference to "an embodiment" does not necessarily mean only one embodiment, and different references to "an embodiment" are not necessarily to the same embodiment(s).

It will be further understood that when an element is referred to as being "connected to", or "coupled to" another element, it may be directly on, connected to, or coupled to the other element, or one or more intervening elements may be present. In addition, it will also be understood that when an element is referred to as being "between" two elements, it may be the only element between the two elements, or one or more intervening elements may also be present.

The terminology used herein is for the purpose of describing particular embodiments only and is not intended to be limiting of the present invention.

As used herein, singular forms may include the plural forms as well and vice versa, unless the context clearly indicates otherwise.

It will be further understood that the terms "comprises," "comprising," "Includes," and "including" when used in this specification, specify the presence of the stated elements and do not preclude the presence or addition of one or more other elements. As used herein, the term "and/or" includes any and all combinations of one or more of the associated listed items.

FIG. 1 is a circuit diagram illustrating a signal transmitting circuit 100 in accordance with an embodiment.

Referring to FIG. 1, the signal transmitting circuit 100 may include a logic gate 110, a pre-driver circuit 120, a first NMOS transistor N1, and a second NMOS transistor N2. The signal transmitting circuit 100 may transmit a signal of an input node IN to an output node OUT.

The logic gate 110 may invert the signal of the input node IN, and transfer the inverted signal to a node A. The logic gate 110 may use a first supply voltage VDD. Since the logic gate 110 uses the first supply voltage VDD, the voltage level of the node A may swing from the level of a pull-down voltage (i.e., ground voltage) VSS to the level of the first supply voltage VDD. The logic gate 110 may include an inverter having an NMOS transistor 111 and a PMOS transistor 112. FIG. 1 illustrates that the logic gate 110 is an inverter, but another type of logic gate may be used as the logic gate 110 instead of an inverter.

The pre-driver circuit 120 may generate a pull-up control signal PU_EN and a pull-down control signal PD_EN in response to the signal of the node A. The pre-driver circuit 120 may enable the pull-up control signal PU_EN to a logic high level when the signal of the node A is at a logic high level. Furthermore, the pre-driver circuit 120 may enable the pull-down control signal PD_EN to a logic high level when the signal of the node A is at a logic low level. The pre-driver circuit 120 may generate the pull-up control signal PU_EN and the pull-down control signal PD_EN using a second supply voltage VNN. Therefore, the pull-up control signal PU_EN and the pull-down control signal PD_EN may swing from the level of the pull-down voltage VSS to the level of the second supply voltage VNN. The second supply voltage VNN may have a level greater than the first supply voltage VDD.

The pre-driver circuit 120 may include an inverter I, a pass gate PG, a pull-up control signal generator 125, and a pull-down control signal generator 130.

The inverter I may invert the signal of the node A, and transfer the inverted signal to a node B. The pass gate PG may transfer the signal of the node A to a node C. The inverter I may include an NMOS transistor 121 and a PMOS transistor 122. The inverter I may be operated by the first supply voltage VDD. The pass gate PG may include an NMOS transistor 123 and a PMOS transistor 124. Since the second supply voltage VNN is applied to the NMOS transistor 123 and the pull-down voltage VSS is applied to the PMOS transistor 124, the pass gate PG may be always retained in an on-state. The pass gate PG may serve to adjust a time required for transferring the signal of the node A to the node B through the inverter I to a time required for transferring the signal of the node A to the node C.

The pull-up control signal generator 125 may include an NMOS transistor 126 and a PMOS transistor 127. When the signal of the node B is at a logic high level, the NMOS transistor 126 may be turned on to disable the pull-up control signal PU_EN to a logic low level. When the signal of the node B is at a logic low level, the PMOS transistor 127 may be turned on to enable the pull-up control signal PU_EN to a logic high level. The pull-up control signal PU_EN may have the level of the second supply voltage VNN when being enabled, or have the level of the pull-down voltage VSS when being disabled.

The pull-down control signal generator 130 may include an NMOS transistor 131 and a PMOS transistor 132. When the signal of the node C is at a logic high level, the NMOS transistor 131 may be turned on to disable the pull-down control signal PD_EN to a logic low level. When the signal of the node C is at a logic low level, the PMOS transistor 132 may be turned on to enable the pull-down control signal PD_EN to a logic high level. The pull-down control signal PD_EN may have the level of the second supply voltage VNN when being enabled, or have the level of the pull-down voltage VSS when being disabled.

The first NMOS transistor N1 may be turned on or off in response to the pull-down control signal PD_EN. When the pull-down control signal PD_EN is enabled, the first NMOS transistor N1 may be turned on to drive the output node OUT to the level of the pull-down voltage VSS. The second NMOS transistor N2 may be turned on or off in response to the pull-up control signal PU_EN. When the pull-up control signal PU_EN is enabled, the second NMOS transistor N2 may be turned on to drive the output node OUT to the level of the first supply voltage VDD.

A driver which uses NMOS transistors such as the first and second NMOS transistors N1 and N2 to pull up or pull down the output node OUT may be referred to as an N-over-N driver. Since the output node OUT needs to be pulled up by the second NMOS transistor N2, the pull-up control signal PU_EN may be enabled to the second supply voltage VNN greater than the first supply voltage VDD. When an NMOS transistor is used for pull-up driving, a higher voltage needs to be used as a voltage for turning on the NMOS transistor. However, since the NMOS transistor has better signal transmission performance than the PMOS transistor, the N-over-N driver may be used.

The output node OUT may be connected to a transmission line having relatively high loading. That is, the output node OUT may be coupled to a long line for transmitting a signal to a remote position. For example, the output node OUT may be coupled to a long data bus and/or a through silicon via (TSV) for transmitting a signal from one chip of stacked chips to another chip.

Figure 2:
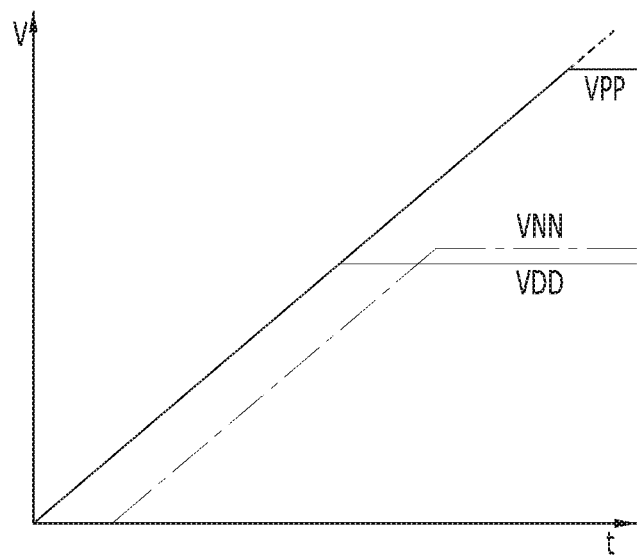
FIG. 2 illustrates a process in which supply voltages are desirably stabilized during an initialization operation of an integrated circuit including a signal transmitting circuit in accordance with an embodiment.

FIG. 2 illustrates a process in which supply voltages VDD, VNN, and VPP are desirably stabilized during an initialization operation of an integrated circuit including a signal transmitting circuit in accordance with an embodiment, for example, the signal transmitting circuit 100 of FIG. 1.

The first supply voltage VDD and the third supply voltage VPP may be supplied to the integrated circuit from outside the integrated circuit. The second supply voltage VNN may be generated by down-converting the third supply voltage VPP in the integrated circuit.

Referring to FIG. 2, the first and third supply voltages VDD and VPP supplied from outside the integrated circuit during power-up may rapidly rise to reach the levels of their target voltages. However, since the second supply voltage VNN is generated by down-converting the third supply voltage VPP in the integrated circuit, the second supply voltage VNN may reach its target voltage while rising more slowly than the first and third supply voltages VDD and VPP. As illustrated in FIG. 2, the levels of the supply voltages VDD, VNN and VPP may have a certain relation when the supply voltages are stabilized: third supply voltage VPP>second supply voltage VNN>first supply voltage VDD.

Figure 3:
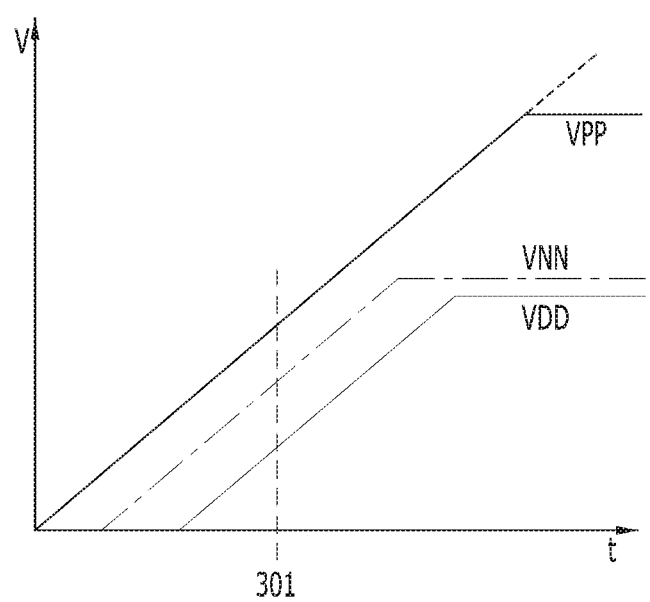
FIG. 3 illustrates a process in which supply voltages are stabilized in a wrong order during an initialization operation of an integrated circuit including a signal transmitting circuit in accordance with an embodiment.

FIG. 3 illustrates a process in which supply voltages VDD, VNN, and VPP are stabilized in a wrong order during an initialization operation of an integrated circuit including a signal transmitting circuit in accordance with an embodiment, for example, the signal transmitting circuit 100 of FIG. 1.

Referring to FIG. 3, the supply voltages VDD, VNN and VPP may not be stabilized in the order illustrated in FIG. 2, but the level of the first supply voltage VDD may rise later than the second supply voltage VNN. Due to unexpected internal factors of the integrated circuit chip, the levels of the supply voltages VDD, VNN, and VPP may be stabilized in an undesirable order as illustrated in FIG. 3.

When the supply voltages VDD, VNN, and VPP are stabilized in a wrong order as illustrated in FIG. 3, the signal transmitting circuit 100 of FIG. 1 may cause a malfunction. For example, since the first supply voltage VDD yet has a low level at a point 301 in FIG. 3, both of the nodes B and C may be set to a low level, regardless of the voltage level of the input node IN. In this state, both of the PMOS transistor 127 and the PMOS transistor 132 may be turned on, and the pull-up control signal PU_EN and the pull-down control signal PD_EN may be simultaneously enabled to a logic high level, because the second supply voltage VNN has a relatively high level at the point 301. Since both of the pull-up control signal PU_EN and the pull-down control signal PD_EN are enabled, the NMOS transistors N1 and N2 may be turned on at the same time. Therefore, a direct current path may be formed between the first supply voltage terminal VDD and the pull-down voltage terminal VSS. Then, a large amount of current may be consumed while a rise in level of the first supply voltage VDD is disturbed.

That is, when the second supply voltage VNN has a level greater than the first supply voltage VDD even though the first supply voltage VDD yet has a low level, the signal transmitting circuit 100 of FIG. 1 may malfunction, and a large amount of current may be consumed.

Figure 4:
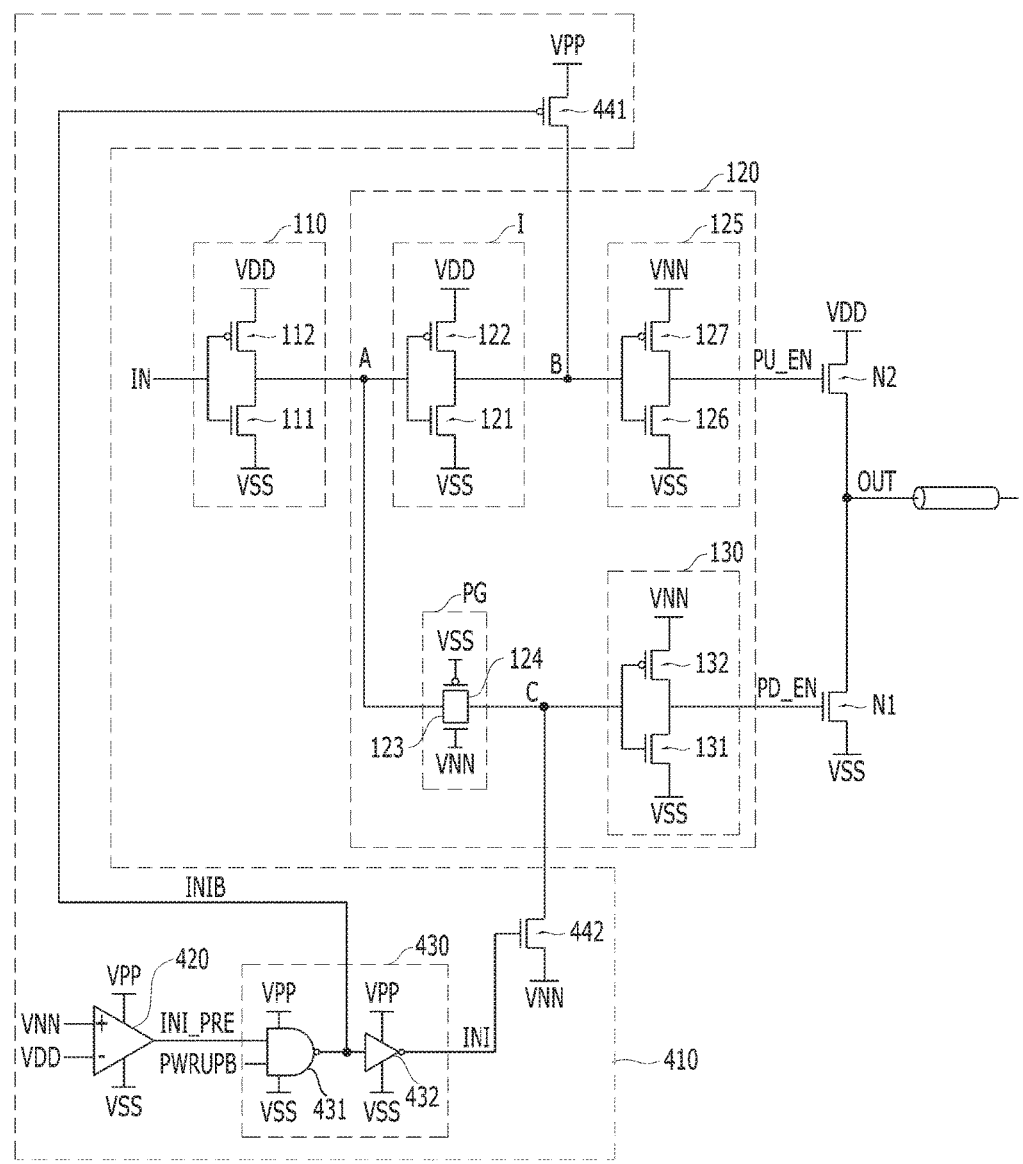
FIG. 4 is a circuit diagram illustrating a signal transmitting circuit in accordance with an embodiment.

FIG. 4 is a circuit diagram illustrating a signal transmitting circuit 400 in accordance with an embodiment.

Referring to FIG. 4, the signal transmitting circuit 400 may include a logic gate 110, a pre-driver circuit 120, a first NMOS transistor N1 and a second NMOS transistor N2. Further, the signal transmitting circuit 400 may include an initialization circuit 410.

The initialization circuit 410 may initialize the pull-up control signal PU_EN and the pull-down control signal PD_EN when the level of the first supply voltage VDD is less than a reference value, before a power-up signal PWRUPB is enabled. In various embodiments, the reference value may be set to (second supply voltage VNN+preset value). During the initialization operation, both of the pull-up control signal PU_EN and the pull-down control signal PD_EN may be disabled to a logic low level.

The initialization circuit 410 may include a comparator 420, an initialization signal generator 430 and initialization units 441 and 442.

The comparator 420 may compare the level of the first supply voltage VDD with the level of the second supply voltage VNN. The comparator 420 may enable a pre-initialization signal INI_PRE when the first supply voltage VDD is not greater than the second supply voltage VNN by a preset value a. The comparator 420 may be designed to operate with an offset corresponding to the preset value a. The comparator 420 may receive the first and second supply voltages VDD and VNN, and enable the pre-initialization signal INI_PRE to a high level when the first supply voltage VDD is not greater than the second supply voltage VNN by the preset value a. The comparator 420 may be operated by the third supply voltage VPP and the pull-down voltage VSS. In various embodiments, the preset value a may be set to a value around the threshold voltage values of the transistors N1 and N2.

The initialization signal generator 430 may enable an initialization signal INI to a logic high level, while the pre-initialization signal INI_PRE is enabled to a logic high level and the power-up signal PWRUPB is disabled to a logic high level. That is, the initialization signal generator 430 may enable the initialization signal INI to a logic high level when the pre-initialization signal INI_PRE is enabled before the power-up signal PWRUPB is enabled. Further, the initialization signal generator 430 may disable the initialization signal INI or fix the initialization signal INI to a logic low level after the power-up signal PWRUPB is enabled. This is because, since all of the supply voltages VDD, VPP and VNN are already stabilized after the power-up signal PWRUPB is enabled, initialization is not needed any more. The power-up signal PWRUPB may be enabled after the first supply voltage VDD reaches its target level, or enabled after the third supply voltage VPP reaches its target level. Furthermore, the power-up signal PWRUPB may be enabled after both of the first and third supply voltages VDD and VPP reach the respective target levels. The initialization signal generator 430 may include a NAND gate 431 and an inverter 432. The NAND gate 431 and the inverter 432 of the initialization signal generator 430 may be operated by the third supply voltage VPP and the pull-down voltage VSS.

The initialization units 441 and 442 may initialize the nodes B and C, respectively, when the initialization signal INI is enabled to a logic high level. The initialization units 441 may include a PMOS transistor and the initialization unit 442 may include an NMOS transistor. The PMOS transistor of the initialization unit 441 may be turned on to initialize the node B to the level of the third supply voltage VPP, when the initialization signal INI is enabled to a logic high level or an inverted initialization signal INIB is enabled to a logic low level. When the initialization signal INI is enabled to a logic high level, the NMOS transistor of the initialization unit 442 may be turned on to initialize the node C to the level of the pull-down voltage VSS.

When the initialization units 441 and 442 are enabled, the node B may be set to a logic high level, and the node C may be set to a logic low level. Thus, the pull-up control signal PU_EN may be disabled, and the pull-down control signal PD_EN may be enabled. Therefore, the first NMOS transistor N1 may be turned on, and the second NMOS transistor N2 may be turned off. That is, it is possible to prevent a malfunction in which the first and second NMOS transistors N1 and N2 are turned on at the same time and a situation in which an excessive amount of current is consumed.

Although the supply voltages VDD, VNN and VPP are stabilized in a wrong order as illustrated in FIG. 3, the signal transmitting circuit 400 may be initialized by the initialization circuit 410, which makes it possible to prevent a malfunction of the signal transmitting circuit 400 and excessive current consumption.

In accordance with the present embodiments, it is possible to reduce a malfunction and current consumption of the signal transmitting circuit.

Although various embodiments have been described for illustrative purposes, it will be apparent to those skilled in the art that various changes and modifications may be made without departing from the spirit and scope of the invention as defined in the following claims.

What is claimed is:

1. A signal transmitting circuit comprising:
   a logic gate suitable for transmitting a signal, and operated by a first supply voltage;
   a pre-driver circuit suitable for generating a pull-up control signal and a pull-down control signal in response to the transmitted signal, wherein a second supply voltage having a level greater than the target level of the first supply voltage is used to generate the pull-up control signal and the pull-down control signal;
   a first NMOS transistor suitable for pulling up an output node using the first supply voltage, in response to the pull-up control signal;
   a second NMOS transistor suitable for pulling down the output node using a pull-down voltage, in response to the pull-down control signal; and
   an initialization circuit suitable for initializing the pull-up control signal and the pull-down control signal when the level of the first supply voltage is less than a reference value, before a power-up signal is enabled.

2. The signal transmitting circuit of claim 1, wherein the reference value corresponds to the sum of the level of the second supply voltage and a preset value.

3. The signal transmitting circuit of claim 1, wherein the initialization circuit is operated by a third supply voltage whose target level is greater than the target level of the second supply voltage.

4. The signal transmitting circuit of claim 3, wherein the first and third supply voltages are external voltages applied from outside an integrated circuit chip including the signal transmitting circuit, and the second supply voltage is an internal voltage generated by an internal voltage generation circuit of the integrated circuit chip using the first and third supply voltages.

5. The signal transmitting circuit of claim 1, wherein the initialization circuit comprises:
   a comparator suitable for comparing the level of the first supply voltage with the level of the second supply voltage, and enabling a pre-initialization signal when the first supply voltage is not greater than the second supply voltage by a preset value;

an initialization signal generator suitable for enabling an initialization signal when the power-up signal is disabled and the pre-initialization signal is enabled; and at least one initialization unit suitable for initializing one or more nodes of the pre-driver circuit to a preset level in response to the initialization signal.

6. The signal transmitting circuit of claim 1, wherein the initialization circuit initializes the pull-up control signal to a low level, and initializes the pull-down control signal to a high level.

7. The signal transmitting circuit of claim 3, wherein the power-up signal is enabled when the first supply voltage is stabilized.

8. The signal transmitting circuit of claim 3, wherein the power-up signal is enabled when the third supply voltage is stabilized.

9. The signal transmitting circuit of claim 3, wherein the power-up signal is enabled when the first and third supply voltages are stabilized.

10. The signal transmitting circuit of claim 2, wherein the preset value comprises a threshold voltage value of the first NMOS transistor.

11. A signal transmitting circuit comprising:
an input node;
an output node:
a logic gate operated by a first supply voltage, suitable for converting a signal of the input node and outputting the converted signal;
a pre-driver circuit suitable for generating a pull-up control signal and a pull-down control signal in response to the converted signal, wherein a second supply voltage having a level greater than the target level of the first supply voltage is used to generate the pull-up and pull-down control signals;
a first transistor suitable for pulling up the output node using the first supply voltage, in response to the pull-up control signal;
a second transistor suitable for pulling down the output node using a pull-down voltage, in response to the pull-down control signal; and an initialization circuit suitable for initializing the pull-up control signal and the pull-down control signal when the level of the first supply voltage is less than a reference value, before a power-up signal is enabled.

12. The signal transmitting circuit of claim 11, wherein the reference value corresponds to the sum of the level of the second supply voltage and a preset value.

13. The signal transmitting circuit of claim 12, wherein the first and second transistors include NMOS transistors.

14. The signal transmitting circuit of claim 13, wherein the preset value comprises a threshold voltage value of the first NMOS transistor.

15. The signal transmitting circuit of claim 11, wherein the initialization circuit is operated by a third supply voltage whose target level is greater than the target level of the second supply voltage.

16. The signal transmitting circuit of claim 15, wherein the power-up signal is enabled when the first supply voltage is stabilized.

17. The signal transmitting circuit of claim 15, wherein the power-up signal is enabled when the third supply voltage is stabilized.

18. The signal transmitting circuit of claim 15, wherein the power-up signal is enabled when the first and third supply voltages are stabilized.

19. The signal transmitting circuit of claim 11, wherein the initialization circuit comprises:
a comparator suitable for comparing the level of the first supply voltage with the level of the second supply voltage, and enabling a pre-initialization signal when the first supply voltage is not greater than the second supply voltage by a preset value;
an initialization signal generator suitable for enabling an initialization signal when the power-up signal is disabled and the pre-initialization signal is enabled; and
at least one initialization unit suitable for initializing one or more nodes of the pre-driver circuit to a preset level in response to the initialization signal.

20. The signal transmitting circuit of claim 1, wherein the initialization circuit initializes the pull-up control signal to a low level, and initializes the pull-down control signal to a high level.

* * * * *